United States Patent
Wu et al.

(10) Patent No.: US 6,950,188 B2
(45) Date of Patent: Sep. 27, 2005

(54) WAFER ALIGNMENT SYSTEM USING PARALLEL IMAGING DETECTION

(75) Inventors: Qiang Wu, Poughkeepsie, NY (US); Bomy A. Chen, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/249,602

(22) Filed: Apr. 23, 2003

(65) Prior Publication Data

US 2004/0212801 A1 Oct. 28, 2004

(51) Int. Cl.$^7$ .............................................. G01B 11/00
(52) U.S. Cl. ...................................................... 356/401
(58) Field of Search ................................ 356/399–401; 355/53, 55; 430/22, 30; 250/548

(56) References Cited

U.S. PATENT DOCUMENTS

| | | | |
|---|---|---|---|
| 4,830,500 A | | 5/1989 | Kuroki et al. |
| 4,971,444 A | * | 11/1990 | Kato ........................... 356/401 |
| 5,106,432 A | | 4/1992 | Matsumoto et al. |
| 5,166,754 A | * | 11/1992 | Suzuki et al. ............... 356/401 |
| 5,194,744 A | | 3/1993 | Aoki et al. |
| 5,621,813 A | * | 4/1997 | Brown et al. ............... 382/151 |
| 5,966,201 A | | 10/1999 | Shiraishi et al. |
| 6,225,012 B1 | | 5/2001 | Nishi et al. |
| 6,278,957 B1 | | 8/2001 | Yasuda et al. |
| 6,417,914 B1 | * | 7/2002 | Li ................................ 355/75 |

FOREIGN PATENT DOCUMENTS

| | | |
|---|---|---|
| EP | 0 450 592 | 10/1991 |
| JP | 62-190724 | 8/1987 |
| JP | 2001-250770 | 9/2001 |

OTHER PUBLICATIONS

Balder et al., "IBM Technical Disclosure Bulletin", Automatic Mask/Wafer Alignment System, vol. 28, No. 4, Sep. 1985, pp. 1474–1479.

* cited by examiner

Primary Examiner—Zandra V. Smith
Assistant Examiner—Gordon J. Stock, Jr.
(74) Attorney, Agent, or Firm—McGinn & Gibb, PLLC; Steven Capella, Esq.

(57) ABSTRACT

A system and method for aligning a wafer in an exposure apparatus includes a holder adapted to hold a wafer (the wafer includes alignment marks), a coarse alignment system, and a fine alignment system having a higher precision than the coarse alignment system. The fine alignment system includes multiple optical detectors. Each of the optical detectors is positioned to detect a corresponding alignment mark on the wafer. An alignment processor is connected to and controls the optical detectors and the holder. The optical detectors are controlled by the alignment processor to simultaneously detect the alignment marks in parallel operations. Further, the alignment processor simultaneously processes signals from the optical detectors in parallel operations.

19 Claims, 4 Drawing Sheets

WAFER ALIGNMENT SYSTEM USING PARALLEL IMAGING DETECTION

BACKGROUND OF INVENTION

The invention generally relates to optical exposure systems for semiconductor wafers and more particularly to an improved system and method that reduces the amount of time needed to align the wafer in the optical exposure system.

With the everspeed of wafer exposure systems, the time spent on alignment is becoming the limiting factor in the total throughput of steppers or stepsystems. Typical time spent for a single wafer alignment can reach as much as 10 seconds, which represents a large portion of the total time that is needed for single wafer exposure. For example, if an exposure process is able to produce 60 wafers per hour, each wafer would take one minute to expose. Similarly, if the exposure process is able to produce 90 wafers per hour, each wafer is exposed in 40 seconds. Therefore, the 10 seconds required to align each wafer becomes a significant factor.

One conventional system attempts to reduce the time required to align the wafer using a "twin stage" system. In such a twin stage system, a single machine includes two wafer stages. While one said wafer stages is being aligned, the other said wafer stages can expose a wafer. This directly eliminates the alignment time; however, such devices are substantially larger (30% in size and weight than the single stage devices and are more expensive than single stage devices. An additional drawback of twin stage systems is that if one of the stages experiences a defect, the machine must stop production, which dramatically increases inefficiency for the single defect.

Therefore, if the savings in alignment time can be achieved using single stage systems, such benefits are produced with fewer drawbacks when compared to twin stage systems. The invention described below reduces the alignment time without having to resort to twin stage systems.

SUMMARY OF INVENTION

To overcome the problems discussed above, the invention provides a system for aligning a wafer in an exposure apparatus. The inventive system includes a holder adapted to hold a wafer (the wafer includes alignment marks), a coarse alignment system, and a fine alignment system having a higher precision than the coarse alignment system. The fine alignment system includes optical detectors. Each of the optical detectors is positioned to detect a corresponding alignment mark on the wafer. An alignment processor is connected to and controls the optical detectors and the holder. The optical detectors are controlled by the alignment processor to simultaneously detect the alignment marks in parallel operations. Further, the alignment processor simultaneously processes signals from the optical detectors in parallel operations.

In addition, in a second embodiment, the optical detectors can be controlled by the alignment processor to simultaneously detect the alignment marks multiple times while the holder moves the wafer up and/or down in a direction perpendicular to the surface of the wafer, which allows the alignment processor to pick the bestimage for each detector from a sequentially acquired series of images through focus alignment position determination.

The alignment marks can comprise twomarks. In one embodiment, the number of alignment marks is equal to the number of optical detectors, such that each optical detector is dedicated to a specific alignment mark. If the number of alignment marks are greater than the number of optical detectors, at least some of the optical detectors detect multiple alignment marks. If there are more alignment marks than optical detectors, the invention would detect as many alignment marks as possible in a first detection process and then detect the remaining alignment marks that were missed during the first detection process in a second detection process. Each of these detection processes performs parallel simultaneous detections of multiple alignment marks using the multiple optical detectors. The alignment marks are preferably positioned so that the invention only needs to shift the wafer a single time to allow the remaining alignment marks to be detected during the subsequent detection process.

Bases of the optical detectors are positioned around a periphery of the wafer in an approximate equally spaced distribution. Alternatively, the invention can include common shafts supporting the optical detectors that surround the wafer. In this embodiment, groups of the optical detectors are connected to each of the common shafts.

The invention also provides a method of aligning the wafer in the exposure apparatus that first mounts a wafer in a holder, then performs the coarse alignment and the fine alignment. The fine alignment has a higher precision than the coarse alignment. The process of performing said fine alignment simultaneously detects multiple alignment marks using a plurality of optical detectors. Each of the optical detectors is positioned to detect a corresponding alignment mark. The invention also simultaneously processes the signals from the optical detectors using the alignment processor. When the holder is moved up and/or down, multiple observations are made during the moving process, again to allow the alignment processor to processes multiple focal regions within the topography of the wafer. This process allows the invention to align the wafer with the optical exposure device based upon signals received from the optical detectors.

The invention also provides a method of calibrating the system used to align the wafer in the optical exposure apparatus. In this methodology, the invention first locates a primary alignment mark on a wafer using a preoptical detector and calibrates the position of the alignment mark and then uses this mark to sequentially calibrate the positions of the remaining optical detectors through the stepping of the wafer stage. Placement of the primary alignment mark and the remaining alignment marks is restricted in a design of the wafer to prevent spatial conflict in the array of optical detectors. This calibration process is generally performed for the first wafer in a batch of wafers that includes a new pattern of alignment marks. Once the system is calibrated, the remaining wafers are simply aligned with parallel detection with the calibrated system.

By simultaneously detecting multiple alignment marks during the finealignment process, the invention substantially reduces the time required to complete the finealignment. This time savings is important because the time required to align the wafer is a large portion of the overall exposure processing time associated with the wafer. Further, the invention is also useful with twin stage systems because, as such twin stage systems move toward the use of faster exposure systems, the alignment process will become the bottleneck of the processing. Therefore, by reducing the time necessary to complete the finealignment, the invention improves many different forms of processing.

Another benefit produced by the invention results from performing multiple image detections as the wafer holder is moved up and/or down. With this feature, the invention solves the wafer topography problem, which changes the current per-mark autofocusing into a parallel process.

BRIEF DESCRIPTION OF DRAWINGS

The invention will be better understood from the following detailed description of preferred embodiments of the invention with reference to the drawings, in which.

DETAILED DESCRIPTION

In order to overcome the problems mentioned above, the optical detectors are controlled by the alignment processor to simultaneously detect the alignment marks in parallel operations. By simultaneously detecting multiple alignment marks during the finealignment process, the invention substantially reduces the time required to complete the fine alignment.

Figure 1:
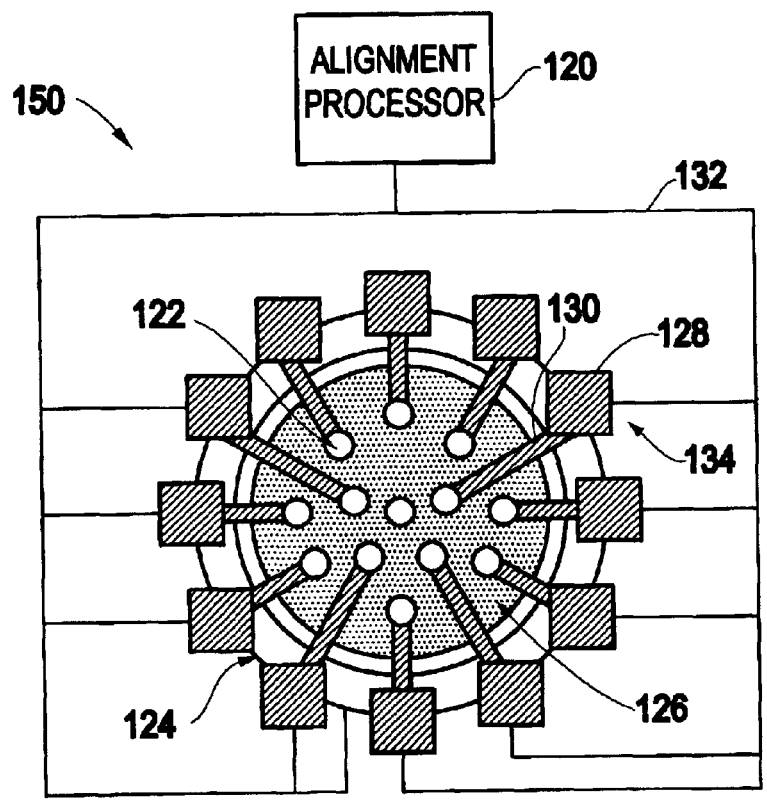
FIG. 1 is a schematic diagram of a wafer alignment system according to the invention.

As shown in FIG. 1, the invention provides a system for aligning a wafer 126 in an exposure apparatus 150. The inventive system includes a holder 124 such as a common wafer chuck or stage. The invention includes a conventional coarse alignment system (not illustrated) such as that disclosed in U.S. Pat. No. 6,225,012 to Nishi et al., which is fully incorporated herein by reference.

The invention also provides a finealignment system (sometimes referred to herein as a "fine alignment" system) having a higher precision than the coarse alignment system. The fine alignment system includes multiple optical units 134. Each of the optical units 134 comprises a microscope that includes some form of optical detector 122 (such as a charge coupled device (CCD) camera, an aperture, lens, fiber optic cable, etc.), a connection arm 130 and a base 128.

Each of the optical detectors 122 is positioned to detect a corresponding alignment mark on the wafer. In the views shown in FIGS. 1 and 2, the alignment marks cannot be seen because they are directly below the optical detectors 122 and are blocked from view by the illustration of the optical detectors 122. However, in FIGS. 3 and 4, discussed below, the alignment marks 142 are represented as small white dots while the optical detectors 122 are represented as grey circles.

An alignment processor 120 is connected to and controls the optical units 134 and the holder 124 through electrical connections 132. The alignment processor 120 can be a single computerized processor or can be multiple processors, depending upon the specific application of the invention. In addition, the wiring connections 132 between the alignment processor 120 and the optical units 134 does not need to include the specific wiring patterns/connections illustrated in FIG. 1. To the contrary, any wiring patterns/connections that will allow the alignment processor 120 to control and receive signals from the optical units 134 (and the holder 124) will work acceptably with the invention. Note that the alignment processor 120 and associated wiring 132 are only illustrated in FIG. 1 and are intentionally omitted from the remaining drawings so as to not obscure the salient features of the invention being illustrated in the remaining drawings.

The optical detectors 122 are controlled by the alignment processor 120 to simultaneously detect the alignment marks 142 in parallel operations. To the contrary, conventional systems use a single fineoptical detector to detect individual alignment marks 142 one at a time in a serial fashion, moving the wafer and/or stage after each alignment mark is detected. Since the invention can detect all alignment marks 142 simultaneously by using multiple optical detectors 122, the amount of time needed to perform the optical detection of alignment marks 142 is substantially reduced. Further, the alignment processor 120 simultaneously processes signals from the optical detectors 122 in parallel operations.

In addition, in a second embodiment, the optical detectors 122 can be controlled by the alignment processor 120 to simultaneously detect the alignment marks 142 multiple times while the holder 124 moves the wafer up and/or down in a direction perpendicular to the surface of the wafer, which allows the alignment processor 120 to processes multiple focal regions within the topography of the wafer. Some current systems perform focusing for individual images by adjusting the height of the holder (in the "Z" direction) prior to acquiring the single image of a single alignment mark. However, there are problems with such autofocusing systems. Since such systems usually require the holder to settle into a stationary position after focus scanning for each alignment mark, the holder settling time will add a substantial amount in the total alignment budget.

The topology of the wafer can vary dramatically (in a relative sense) between alignment marks 142. If the images of the alignment marks 142 are captured simultaneously (as with the present invention) some of the marks will be in focus while others will be out of focus because of the topology height variations. To accommodate this situation, the invention provides a new autofocusing system that moves the height of the holder through an acceptable range of focus steps (preferably including all focus depths needed to allow all the optical detectors to acquire sharp images). During the processing of such images by the alignment processor 120, only the most undistorted image from each optical unit 134 is used. Even though this requires that each optical unit 134 to acquire multiple images at the different focus depths, the images can be taken much faster than with conventional systems because the invention does not require the wafer holder to settle into stationary positions for individual marks, which saves settling time. Secondly, the acquisition of many images in a digital format provides opportunities for further image analysis to more accurately determine the bestpositions.

The alignment marks 142 can comprise twomarks. In one embodiment, the number of alignment marks 142 is equal to the number of optical detectors 122, such that each optical detector is dedicated to a specific alignment mark. If the number of alignments marks are greater than the number of optical detectors 122, at least some of the optical detectors 122 detect multiple alignment marks 142. Therefore, in the embodiment where the number of alignment marks 142 exceeds the number or optical detectors 122, the invention would detect as many alignment marks 142 as possible in a first alignment process and then detect the remaining alignment marks 142 that were missed during the first detection process in a second detection process. Each of these detection processes performs parallel simultaneous detections of multiple alignment marks 142 using the multiple optical detectors 122. The alignment marks 142 are preferably positioned so that the invention only needs to shift the wafer a single time to allow the remaining alignment marks 142 to be detected during the subsequent detection process (or multiple subsequent detection processes).

Figure 2:
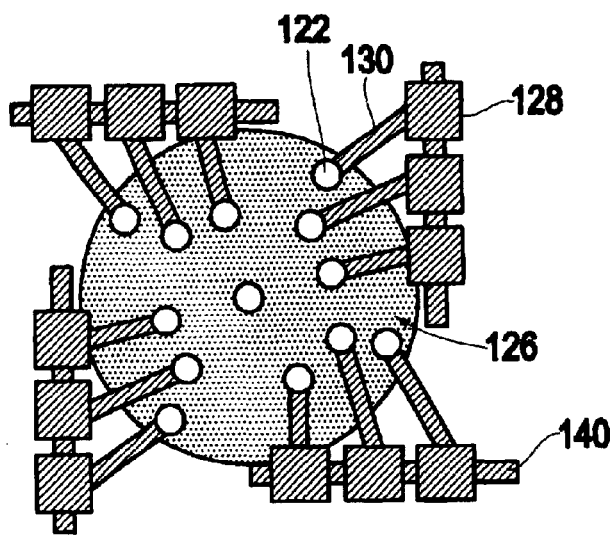
FIG. 2 is a schematic diagram of a wafer alignment system according to the invention.

Bases of the optical detectors 122 are positioned around a periphery of the wafer in an approximate equally spaced distribution. Alternatively, as shown in FIG. 2, the invention can include common shafts 140 supporting the optical detectors 122 that surround the wafer. In this embodiment, groups of the optical detectors 122 are connected to each of the common shafts 140.

Figure 4:
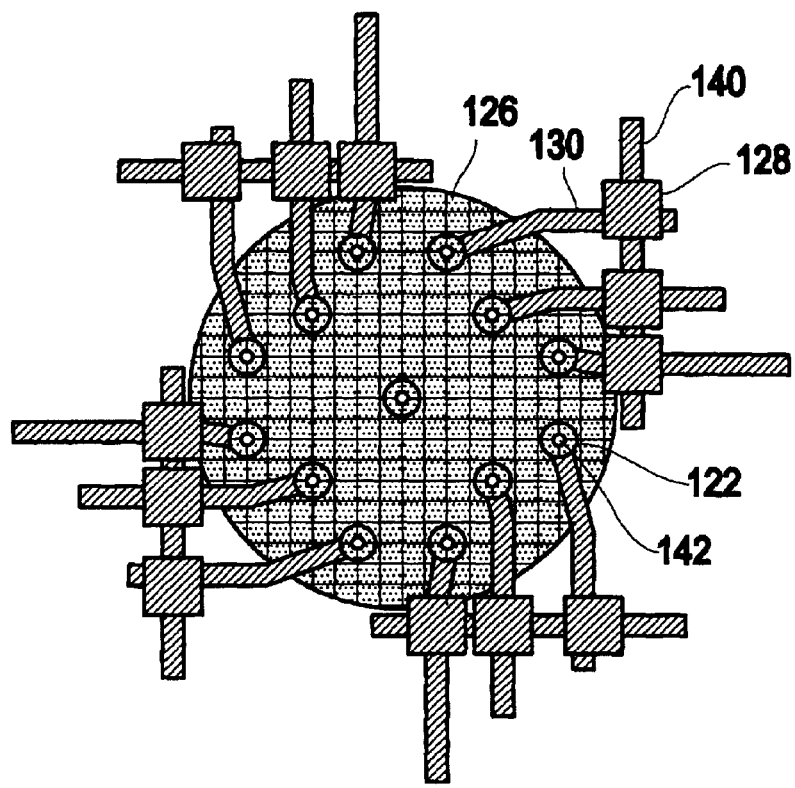
FIG. 4 is a schematic diagram of the invention being applied to a common pattern of wafer alignment marks.
Figure 3:
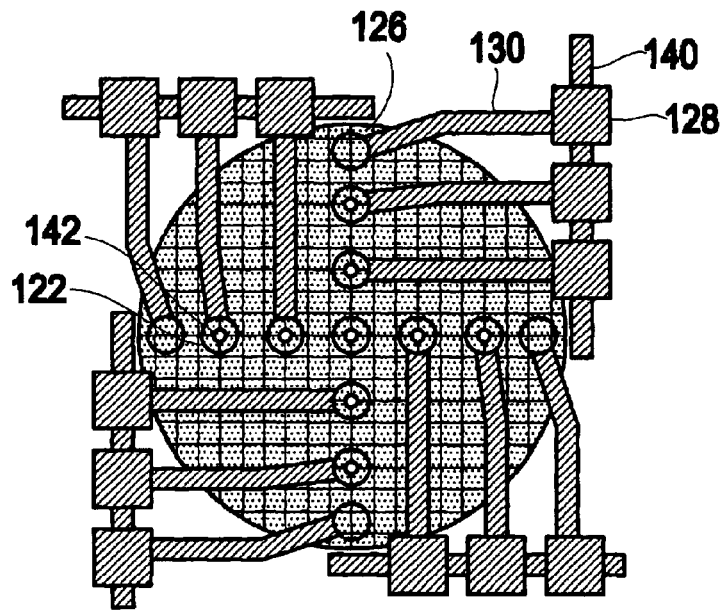
FIG. 3 is a schematic diagram of the invention being applied to a common pattern of wafer alignment marks.

FIGS. 3 and 4 shown the inventive features discussed above used with common alignment mark patterns. In FIGS. 3 and 4, the alignment marks 142 are shown as small white dots, while the position of the optical detectors 122 is shown as gray circles. The alignment mark pattern shown in FIG. 3 is intersecting linear sets of alignment marks 142 that preferably intersect at the center of the wafer. The alignment mark pattern shown in FIG. 4 places the alignment marks 142 in an approximately equal distribution along the wafer to form an approximate circle of alignment marks 142.

Figure 5:
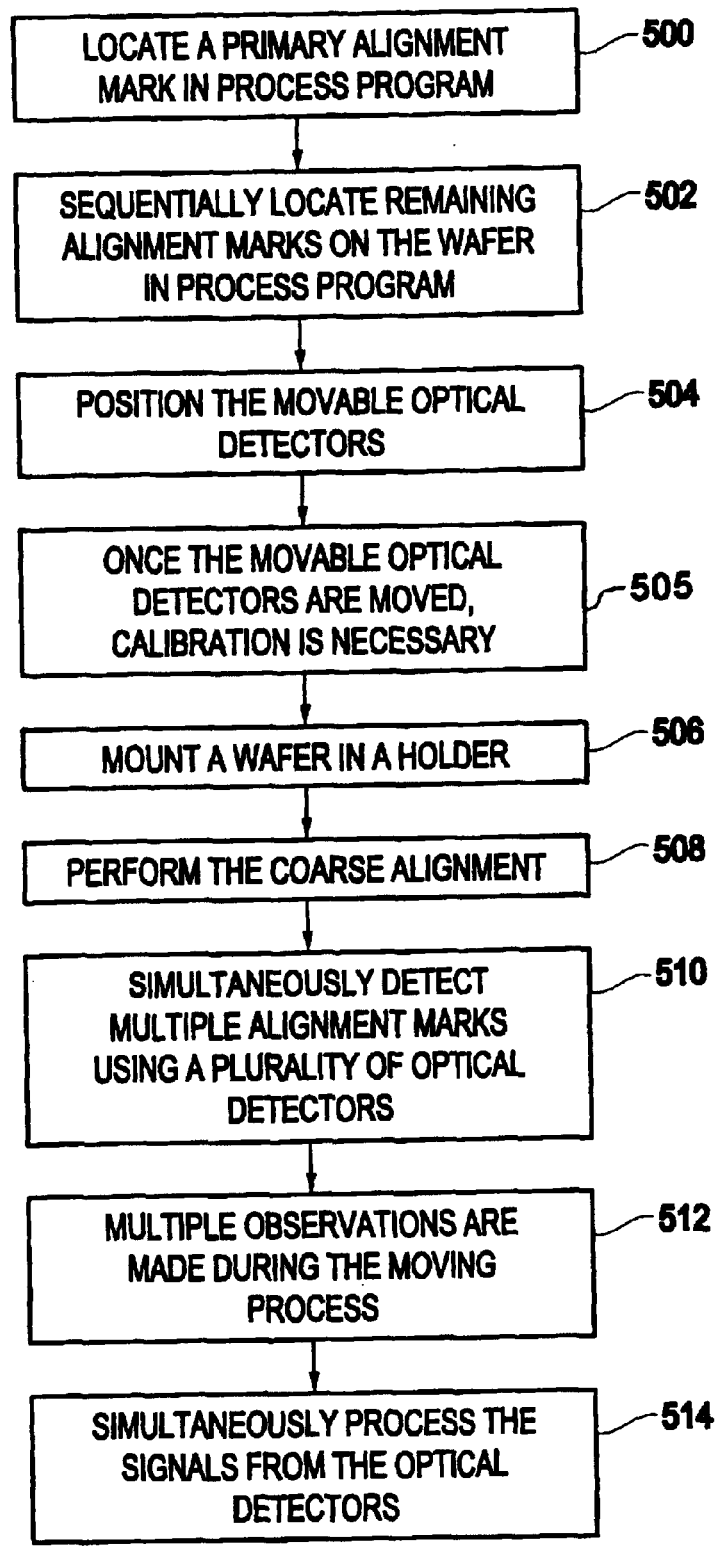
FIG. 5 is a flow diagram illustrating a preferred method of the invention.

As shown in FIG. 5, the invention also provides a method of calibrating the system used to align the wafer in the optical exposure apparatus. For the first wafer in a set of wafers that has a new alignment mark pattern, the invention first locates a primary alignment mark on the wafer using a preoptical detector 500. In item 502, the invention sequentially locates remaining alignment marks on the wafer. In item 504, the invention positions the movable optical detectors. Once the movable optical detectors are moved, calibration is necessasry, as shown in item 505. The primary alignment mark is preferably located at a known position (e.g., the very center) of the wafer. Further, the primary alignment mark would be detected using an optical detector that is permanently positioned (preto detect alignment marks at that known position (the center) of the wafer. In the illustrations shown in FIGS. 1 it is presumed that the preoptical detector is positioned to detect an alignment mark at the center of the wafer. Therefore, the figures do not illustrate an optical detector that can be adjusted over the center alignment mark. Thus, the primary alignment optical detector is distinguished from the remaining optical detectors because the position of the primary alignment optical detector cannot be changed while the positions of the remaining optical detectors can (e.g., by movement of the base 128, connection arm 130, and/or common shafts 140). The location of all alignment marks are determined in the process program (the user definable software code). The system then uses the wafer stage to step this alignment mark to the rest of the detectors to calibrate their positions since all position information originates from the position of the wafer stage/holder. Placement of the primary alignment mark and the remaining alignment marks is restricted in a design of the wafer to prevent overlapping of the optical detectors 122. This calibration process is generally performed for the first wafer in a batch of wafers that includes a new pattern of alignment marks. Once the system is calibrated, the remaining wafers are simply aligned with the calibrated system.

As also shown in FIG. 5, the invention also provides a method of aligning the wafer in the exposure apparatus that first mounts a wafer in a holder 506, then performs the coarse alignment 508 and the fine alignment 510 The fine alignment has a higher precision than the coarse alignment. The process of performing the fine alignment simultaneously detects multiple alignment marks using a plurality of optical detectors 510. If the holder is moved up and/or down, multiple observations are made during the moving process 512, again to allow the alignment processor to processes multiple focal regions within the topography of the wafer. The invention also simultaneously processes the signals from the optical detectors 514. This process allows the invention to align the wafer with the optical exposure device based upon signals received from the optical detectors.

Figure 6:
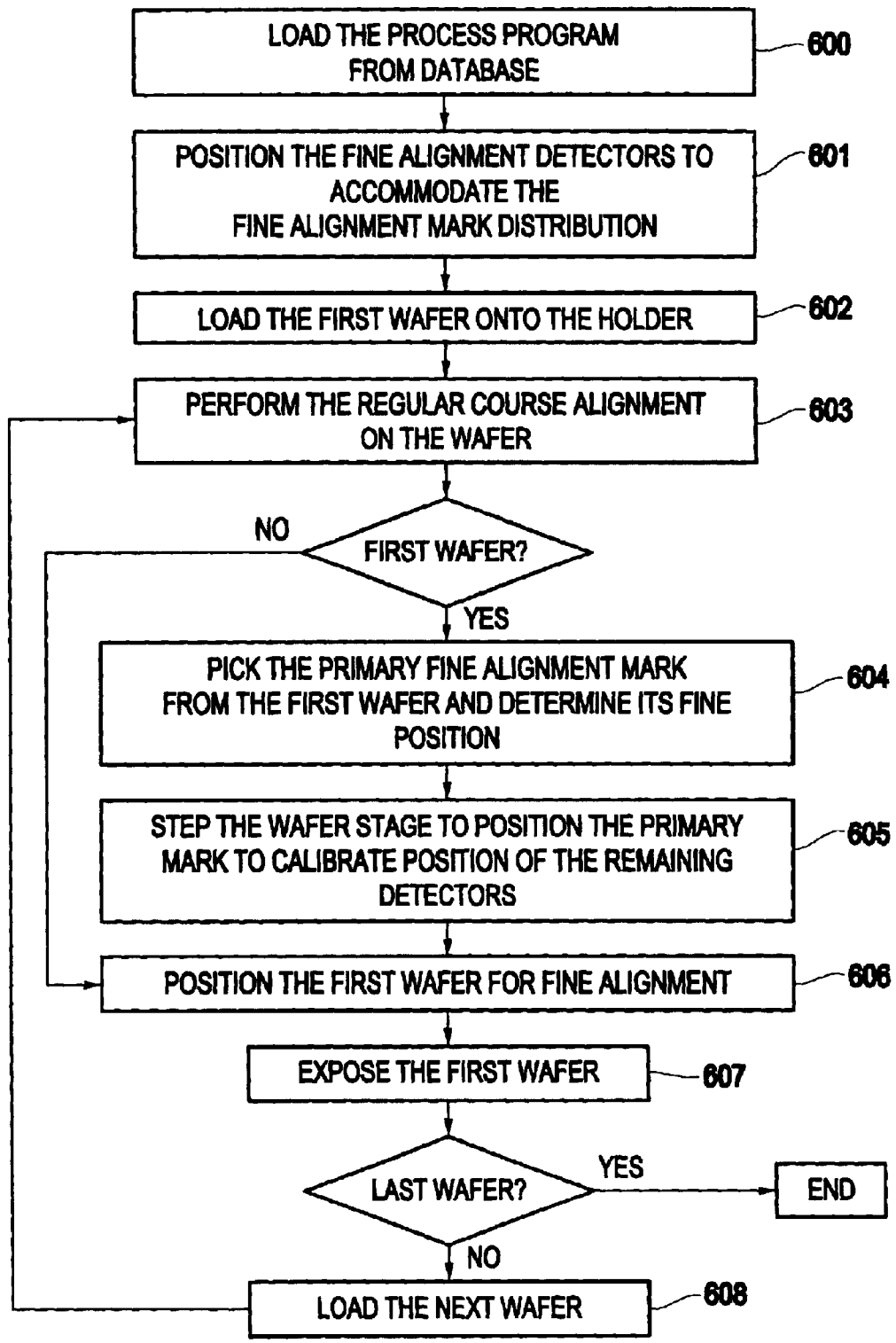

FIG. 6 is a flowchart illustrating the invention. In item 600, the invention loads the process program from the database for an incoming lithography level which includes the choice of the number and location of the alignment marks (both coarse and fine). Next, in item 601, the invention positions the fine alignment detectors to accommodate the fine alignment mark distribution. The invention then loads the first wafer onto the holder, in item 602. In item 603, the invention performs the regular coarse alignment (using coarse alignment detectors) on the wafer, the function of which is to center the fine alignment marks to within the capture range of the fine alignment detectors. Next, in item 604, the invention picks the primary fine alignment mark from the first wafer, and determines its fine position using the primary detector, which is pre In item 605, the invention steps the wafer stage sequentially to position the primary fine alignment mark under each of the remaining moveable fine detectors to calibrate their positions. In item 606, the invention positions the first wafer for fine alignment, scans the wafer stage/holder in the vertical axis, (z-plane) from all detectors in parallel, acquires the images through focus for each alignment mark, and picks the bestimage to determine alignment positions. In item 607, the invention exposes the said first wafer. Lastly, in item 608, the invention loads the next wafer and starts from step 603 and skips step 604 and 605 (calibration) until the end of the batch.

By simultaneously detecting multiple alignment marks during the finealignment process, the invention substantially reduces the time required to complete the fine alignment. This time savings is important because the time required to align the wafer is a large portion of the overall exposure processing time associated with the wafer. Further, the invention is useful with twin stage systems because, as such twin stage systems reduce exposure times, the alignment process will become the bottleneck of the processing. Therefore, by reducing the time necessary to complete the finealignment, the invention improves many different forms of processing.

Another benefit produced by the invention results from performing multiple image detections as the wafer holder 124 is moved up and/or down. With this feature, the invention does not need to rely upon conventional autofocusing (which the settling time slows down process). Instead, by acquiring multiple images at different focal lengths, the invention can simply select the best image and this image will be undistorted and more accurately reflect the alignment of the wafer. The invention is that the invention saves time for alignment by operating in parallel mode and using autofocus. The invention also improves the throughput for single stage wafer exposure systems and for twinwafer exposure systems.

While the invention has been described in terms of preferred embodiments, those skilled in the art will recognize that the invention can be practiced with modification within the spirit and scope of the appended claims.

What is claimed is:

1. A system for aligning a wafer in an exposure apparatus, said system comprising:
   a holder adapted to hold a wafer, wherein said wafer includes a plurality of alignment marks and wherein said holder is adapted to move in a direction perpendicular to the surface of said wafer;
   a coarse alignment system;
   a fine alignment system having a higher precision than said coarse alignment system, wherein said fine alignment system includes a plurality of optical detectors, and wherein each of said optical detectors is positioned to detect a corresponding alignment mark of said alignment marks on said wafer; and an alignment processor connected to and controlling said optical detectors and said holder, wherein said optical detectors are controlled by said alignment processor to simultaneously detect said alignment marks, and wherein said optical detectors are controlled by said alignment processor to simultaneously detect said alignment marks multiple times while said holder moves said wafer in said direction perpendicular to said surface of said wafer.

2. The system in claim 1, wherein when said alignment processor controls said optical detectors to simultaneously detect said positions of said alignment marks multiple times while said holder moves said wafer in said direction perpendicular to said surface of said wafer, said alignment processor processes multiple focal regions within the topography of said wafer.

3. The system in claim 1, wherein said alignment marks comprise two dimensional marks.

4. The system in claim 1, wherein said alignment processor is adapted to simultaneously process signals from said optical detectors.

5. The system in claim 1, wherein bases of said optical detectors are positioned around a periphery of said wafer in an approximate equally spaced distribution.

6. The system in claim 1, further comprising common shafts supporting said optical detectors and surrounding said wafer, wherein groups of said optical detectors are connected to each of said common shafts.

7. The system in claim 1, wherein the number of alignment marks is equal to the number of optical detectors, such that each optical detector is dedicated to a specific alignment mark.

8. The system in claim 1, wherein the number of alignments marks is greater than the number of optical detectors and at least one of said optical detectors detect multiple alignment marks.

9. A method of aligning a wafer in an exposure apparatus, said method comprising:

mounting a wafer in a holder, wherein said wafer includes a plurality of alignment marks;

performing a coarse alignment; and performing a fine alignment, wherein said fine alignment has a higher precision than said coarse alignment, and wherein said process of performing said fine alignment comprises:

moving said holder in a direction perpendicular to the surface of said wafer;

simultaneously detecting multiple alignment marks multiple times using a plurality of optical detectors during said moving process, wherein each of said optical detectors is positioned to detect a corresponding alignment mark of said alignment marks on said wafer, and simultaneously processing signals from said optical detectors using an alignment processor.

10. The method in claim 9, wherein said alignment marks comprise two-dimensional marks.

11. The method in claim 9, further comprising simultaneously processing signals from said optical detectors.

12. The method in claim 9, where the number of alignment marks is equal to the number of optical detectors, such that each optical detector is dedicated to a specific alignment mark.

13. The method in claim 9, wherein the number of alignment marks is greater than the number of optical detectors and at least one of said optical detectors detect multiple alignment marks in series.

14. The method in claim 9, further comprising aligning said wafer with an optical exposure device based upon signals received from said optical detectors.

15. A method of calibrating a system used to align a wafer in an optical exposure apparatus, wherein said system includes a coarse alignment system and plurality of fine level optical detectors, wherein said method calibrates said optical detectors and comprises:

locating a primary alignment mark on a wafer using a pre-calibrated optical detector; and sequentially locating remaining alignment marks on said wafer and positioning remaining optical detectors above said remaining alignment marks such that said remaining optical detectors are positioned over said remaining alignment marks.

16. The method and claim 15, wherein placement of said primary alignment mark and said remaining alignment marks is restricted in a design of said wafer to prevent overlapping of said optical detectors.

17. The method in claim 15, wherein said process of sequentially locating said remaining alignment marks positions said remaining optical detectors to detect multiple alignment marks, if the number of alignment marks exceeds the number of optical detectors.

18. The method in claim 15, further comprising positioning bases of said optical detectors around a periphery of said wafer in approximate equally spaced distribution.

19. The method in claim 15, further comprising supporting groups of said optical detectors using common shafts.

* * * * *